(12) United States Patent
Liang

(10) Patent No.: US 11,972,967 B2
(45) Date of Patent: Apr. 30, 2024

(54) WAFER PROCESSING SYSTEM, SEMICONDUCTOR-MACHINE AUTOMATIC LEVELING APPARATUS AND LEVELING METHOD THEREOF

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/444,178

(22) Filed: Jul. 30, 2021

(65) Prior Publication Data
US 2021/0358789 A1   Nov. 18, 2021

Related U.S. Application Data

(63) Continuation of application No. PCT/CN2021/077105, filed on Feb. 20, 2021.

(30) Foreign Application Priority Data

Feb. 21, 2020   (CN) .......................... 202010108616.6

(51) Int. Cl.
*H01L 21/68*   (2006.01)
*G01C 9/06*   (2006.01)
(Continued)

(52) U.S. Cl.
CPC ............... *H01L 21/68* (2013.01); *G01C 9/06* (2013.01); *G01C 9/32* (2013.01);
(Continued)

(58) Field of Classification Search
CPC ............... H01L 21/68; H01L 21/67259; H01L 21/68764; G03F 7/70725; G03F 7/70716
See application file for complete search history.

(56) References Cited

U.S. PATENT DOCUMENTS

2021/0358789 A1*  11/2021  Liang ..................... H01L 21/68

FOREIGN PATENT DOCUMENTS

CN         201795793 U    4/2011
CN         107785301 A    3/2018
(Continued)

OTHER PUBLICATIONS

International Search Report in Application No. PCT/CN2021/077105, mailed on May 26, 2021.

*Primary Examiner* — Kaitlin S Joerger
(74) *Attorney, Agent, or Firm* — Syncoda LLC; Feng Ma

(57) ABSTRACT

A semiconductor-machine automatic leveling apparatus includes an inclination adjusting gear, a motor, a driving gear, an inclination acquisition mechanism and a controller. The inclination adjusting gear is configured to drive one side of a tabletop of a wafer transfer machine to move up and down. The driving gear is mounted on a rotation shaft of the motor and engaged with the inclination adjusting gear. The inclination acquisition mechanism is configured to acquire inclination information of the tabletop of the wafer transfer machine and electrically connected to the controller. The controller is electrically connected to the motor and configured to control the motor to operate according to the inclination information.

16 Claims, 3 Drawing Sheets

(51) Int. Cl.
    *G01C 9/32*     (2006.01)
    *H01L 21/67*     (2006.01)
    *H01L 21/687*     (2006.01)
    *G01L 1/18*     (2006.01)

(52) U.S. Cl.
    CPC .. *H01L 21/67259* (2013.01); *H01L 21/68764* (2013.01); *G01C 2009/066* (2013.01); *G01L 1/18* (2013.01)

(56) References Cited

FOREIGN PATENT DOCUMENTS

| CN | 110426920 A | 11/2019 |
|----|-------------|---------|
| TW | 201302379 A | 1/2013  |

\* cited by examiner

WAFER PROCESSING SYSTEM, SEMICONDUCTOR-MACHINE AUTOMATIC LEVELING APPARATUS AND LEVELING METHOD THEREOF

CROSS-REFERENCE TO RELATED APPLICATIONS

This application is a continuation of International Patent Application No.: PCT/CN2021/077105 filed on Feb. 20, 2021, which claims priority to Chinese Patent Application No. 202010108616.6 filed on Feb. 21, 2020. The disclosures of these applications are hereby incorporated by reference in their entirety.

BACKGROUND

A wafer processing system typically includes a gluing development device, an exposure machine and a wafer transfer machine. The gluing development device is configured to coat a surface of a wafer before the exposure machine exposes the wafer, and cooperate with the exposure machine to complete a lithography process. The exposure machine is configured to transfer a pattern onto the wafer. The wafer transfer machine is configured to receive the wafer coated by the gluing development device, transfer the wafer to the exposure machine, and transfer the wafer back to the wafer transfer machine after the exposure machine exposes the wafer.

SUMMARY

The present disclosure relates to a wafer processing system, a semiconductor-machine automatic leveling apparatus and a leveling method thereof.

According to various embodiments, the present disclosure provides a semiconductor-machine automatic leveling apparatus, including: an inclination adjusting gear configured to drive one side of a tabletop of a wafer transfer machine to move up and down; a motor and a driving gear, the driving gear being mounted on a rotation shaft of the motor, and the driving gear being engaged with the inclination adjusting gear; and an inclination acquisition mechanism and a controller, the inclination acquisition mechanism being configured to acquire inclination information of the tabletop of the wafer transfer machine, the inclination acquisition mechanism being electrically connected to the controller, the controller being electrically connected to the motor, and the controller being configured to control the motor to operate according to the inclination information.

According to various embodiments, the present disclosure further provides a leveling method of the semiconductor-machine automatic leveling apparatus, including the following steps:
acquiring inclination information of a tabletop of a wafer transfer machine;
obtaining a degree of inclination of the tabletop according to the inclination information; and
leveling the tabletop according to the degree of inclination of the tabletop.

According to various embodiments, the present disclosure further provides a wafer processing system, including the semiconductor-machine automatic leveling apparatus, and further including a wafer transfer machine, the inclination adjusting gear being configured to drive one side of a tabletop to move up and down; and the inclination adjusting gear, the motor and the driving gear being all arranged on the wafer transfer machine.

Other feature and advantages of the present disclosure will become apparent from the specification, the drawings and the claims.

BRIEF DESCRIPTION OF DRAWINGS

The accompanying drawings constituting a part of the present disclosure are used to provide further understanding of the present disclosure. Illustrative embodiments and descriptions thereof of the present disclosure are used to explain the present disclosure, and do not constitute improper limitations on the present disclosure.

In order to more clearly illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can also be obtained by those of ordinary skill in the art from the provided drawings without creative efforts.

REFERENCE NUMERALS

Figure 1:
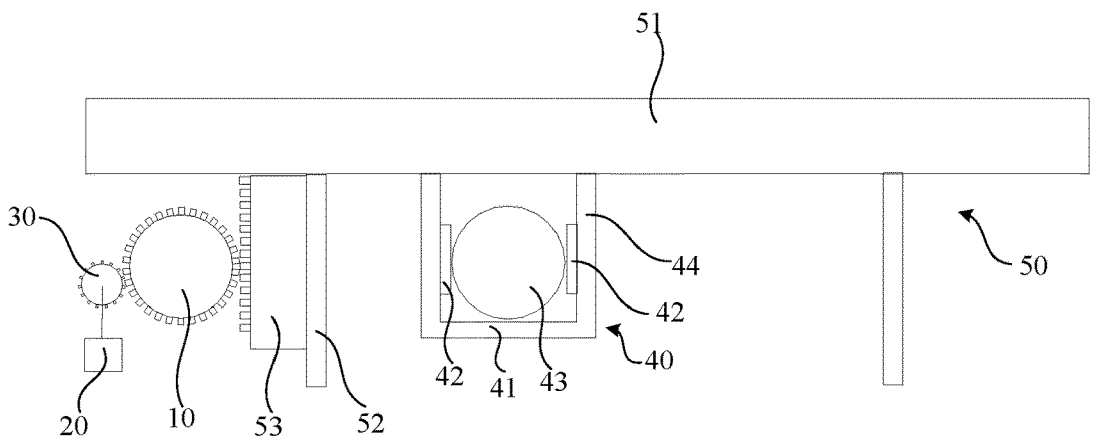
FIG. 1 is a schematic structural diagram of arrangement of a semiconductor-machine automatic leveling apparatus on a wafer transfer machine according to some embodiments of the present disclosure.

10: inclination adjusting gear; 20: motor; 30: driving gear; 40: inclination acquisition mechanism; 41: base; 42: pressure-sensitive sensing element; 43: movable member; 44: first baffle; 45: second baffle; 50: wafer transfer machine; 51: tabletop; 52: guide rail; 53: rack; 60: adjustment component; 61: adjustment hole; 70: transmission component; 80: bubble levelness sensor; 91: camera; 92: lighting lamp.

DESCRIPTION OF EMBODIMENTS

A wafer processing system includes a gluing development device, an exposure machine and a wafer transfer machine. During long-time transfer by the wafer transfer machine, base wear may be inevitably caused, which then affects the levelness of a tabletop of the wafer transfer machine.

The levelness of the wafer on the tabletop can therefore be affected, which may further cause lithographic overlay to deviate, such that the processing quality of wafer products is reduced. In order to ensure that the tabletop of the wafer transfer machine is in a horizontal plane, it is usually necessary to adjust the levelness of the tabletop of the wafer transfer machine, so that the tabletop of the wafer transfer machine is level enough to transfer the wafer well.

In the step of adjusting the levelness of the tabletop of the wafer transfer machine, a lot of manual cooperation is required to perform disassembly/assembly and adjust the levelness of the tabletop of the wafer transfer machine, which has higher requirements for operators and can only be completed with the cooperation of many people, resulting in higher labor costs and lower working efficiency. In addition, the disassembly/assembly process may also damage parts to some extent, resulting in a reduction in the service life of the apparatus.

Various embodiments of the present disclosure provide a wafer processing system, a semiconductor-machine automatic leveling apparatus and a leveling method thereof, which can timely adjust the levelness of the tabletop, have higher working efficiency, reduce labor costs, avoid damage to parts, and prolong the service life.

In order to make the above objectives, features and advantages of the present disclosure more comprehensible, specific implementations of the present disclosure are described in detail below with reference to the accompanying drawings. Many specific details are described below for full understanding of the present disclosure. However, the present disclosure may be implemented in other manners different from those described herein. It may be appreciated by those of ordinary person skilled in the art that similar improvement may be made without departing from the idea of the present disclosure. The present disclosure is thus not limited by specific embodiments disclosed below.

In the description of the present disclosure, it should be understood that, the terms "first" and "second" are used for descriptive purposes only, which cannot be construed as indicating or implying a relative importance, or implicitly specifying the number of the indicated technical features. Thus, the features defined with "first" and "second" may explicitly or implicitly include one or more features. In the description of the present disclosure, "a plurality of" means at least two, such as two or three, unless specifically stated otherwise.

In the description of the present disclosure, it should be understood that, when an element is considered as "connected to" another element, the element may be directly connected to the another element or an intermediate element may co-exist. Conversely, when an element is referred to as "directly" connected to another element, no intermediate element exists.

Figure 2:
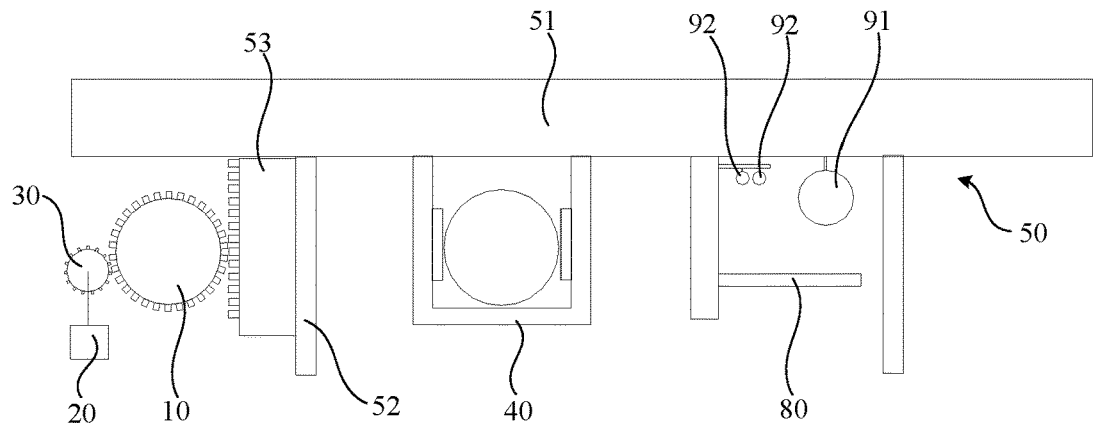
FIG. 2 is a schematic structural diagram of arrangement of a semiconductor-machine automatic leveling apparatus on a wafer transfer machine according to some other embodiments of the present disclosure.
Figure 3:
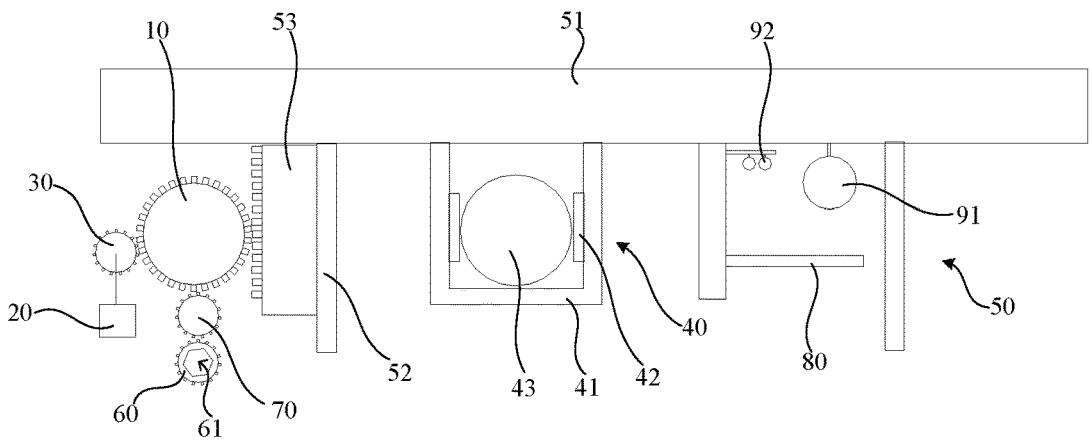
FIG. 3 is a schematic structural diagram of arrangement of a semiconductor-machine automatic leveling apparatus on a wafer transfer machine according to yet some other embodiments of the present disclosure.

In one embodiment, referring to any one of FIG. 1 to FIG. 3, a semiconductor-machine automatic leveling apparatus includes an inclination adjusting gear 10, a motor 20, a driving gear 30, an inclination acquisition mechanism 40 and a controller. The inclination adjusting gear 10 is configured to drive one side of a tabletop 51 of a wafer transfer machine 50 to move up and down. The driving gear 30 is mounted on a rotation shaft of the motor 20 and engaged with the inclination adjusting gear 10. The inclination acquisition mechanism 40 is configured to acquire inclination information of the tabletop 51 of the wafer transfer machine 50 and electrically connected to the controller. The controller is electrically connected to the motor 20 and configured to control the motor 20 to operate according to the inclination information.

In the semiconductor-machine automatic leveling apparatus, the inclination acquisition mechanism 40 acquires the inclination information of the tabletop 51 of the wafer transfer machine 50 in real time, the controller analyzes according to the inclination information whether the tabletop 51 tilts, and if the tabletop 51 tilts, the controller controls the motor 20 to operate accordingly, the driving gear 30 on the rotation shaft of the motor 20 drives the inclination adjusting gear 10 to rotate accordingly, and the inclination adjusting gear 10 drives, during rotation, one side of the tabletop 51 of the wafer transfer machine 50 to move up and down, so that the tabletop 51 of the wafer transfer machine 50 can be adjusted to a horizontal plane in real time.

Further, the semiconductor-machine automatic leveling apparatus further includes a driver arranged between the controller and the motor 20. The controller is electrically connected to the motor 20 through the driver. The motor 20 rotates by a preset angle under the control of the driver.

Further, the semiconductor-machine automatic leveling apparatus further includes a photoelectric code disk and a storage circuit. The photoelectric code disk is electrically connected to the controller, and the storage circuit is electrically connected to the controller. The controller may calculate a rotation angle of the rotation shaft of the motor 20 according to the photoelectric code disk and record, through the storage circuit, the inclination information (which, for example, is specifically a voltage signal corresponding to a sensed pressure value in the following embodiment) outputted by a pressure-sensitive sensing element 42 and the rotation angle of the rotation shaft of the motor 20. The control parameter may be further optimized in combination with a software algorithm.

The working principle of the photoelectric code disk is as follows. In operation, light is projected onto the photoelectric code disk, and the photoelectric code disk rotates with a moving object. After passing through a slit, the light penetrating through a bright zone is received by photosensitive sensing elements arranged in one-to-one correspondence with yards. Signals outputted by the photosensitive sensing elements in the bright zone and a dark zone are "1" and "0" respectively. When the photoelectric code disk rotates to different positions, a combination of the signals outputted by the photosensitive sensing elements shows digital quantity of a certain rule which represents angular displacement of an axis of the code disk.

Further, the semiconductor-machine automatic leveling apparatus further includes a signal conditioning circuit arranged between the pressure-sensitive sensing element 42 and the controller. The pressure-sensitive sensing element 42 is electrically connected to the controller through the signal conditioning circuit. In this way, the pressure-sensitive sensing element 42 converts a sensed pressure into an electrical signal and outputs the electrical signal to the signal conditioning circuit. The signal conditioning circuit processes, for example, filters and amplifies, the electrical signal and then transmits the processed electrical signal to the controller.

The controller may specifically be a micro-controller, which is small-sized and has a small footprint.

Figure 5:
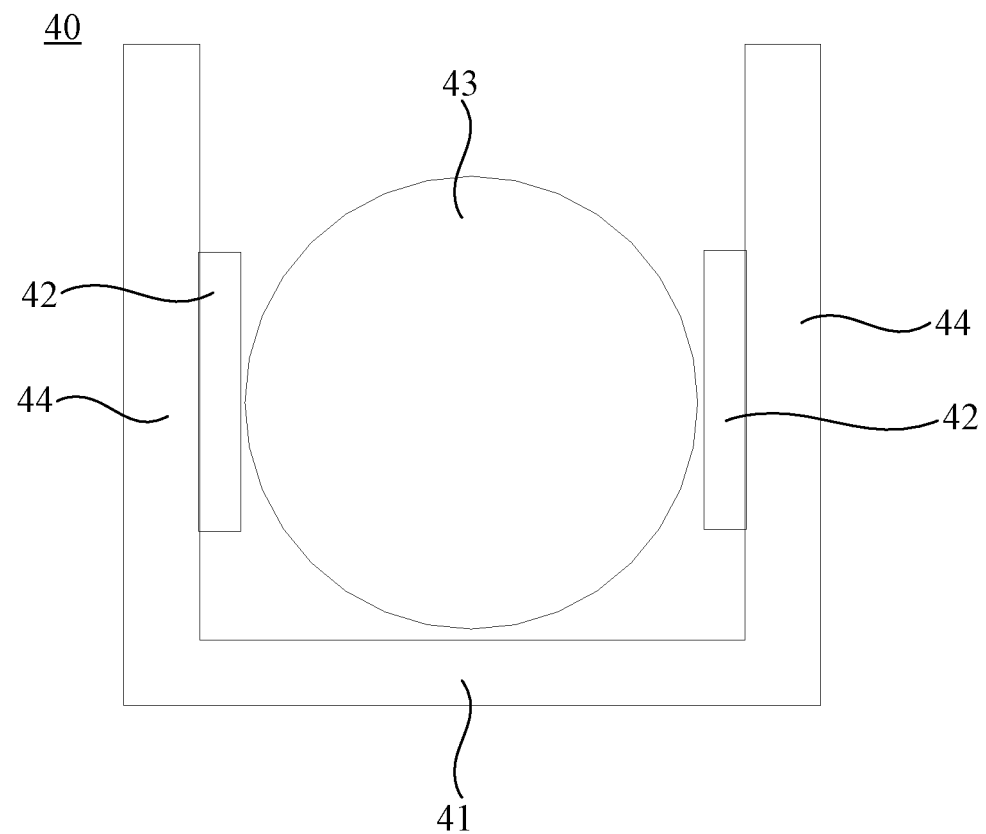
FIG. 5 is a schematic structural diagram of an inclination acquisition mechanism of a semiconductor-machine automatic leveling apparatus according to some embodiments of the present disclosure.
Figure 6:
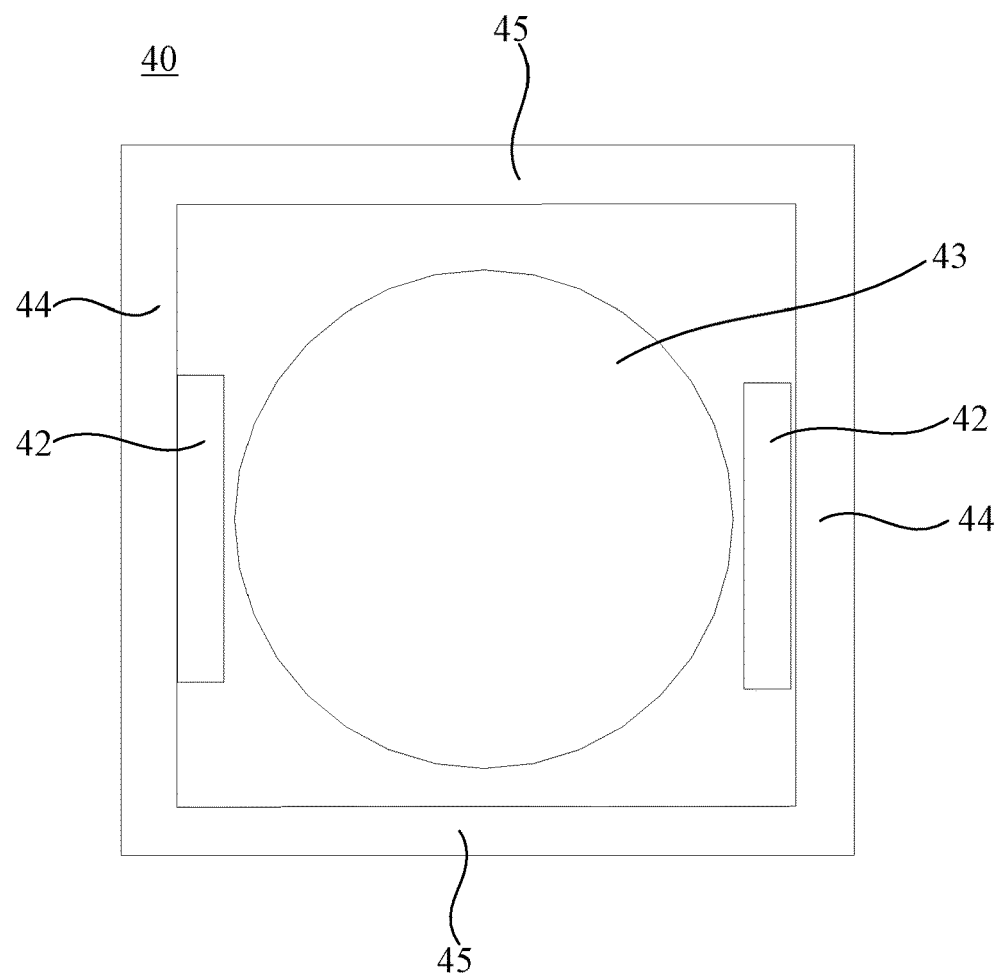
FIG. 6 is a schematic top-view structural diagram of an inclination acquisition mechanism of a semiconductor-machine automatic leveling apparatus according to some embodiments of the present disclosure.

Further, referring to FIG. 3, FIG. 5 and FIG. 6, an outer diameter of the driving gear 30 is less than that of the inclination adjusting gear 10. In this way, under the same adjustment requirement, more angles can be turned to further optimize the adjustment effect, and the control over inclination is more accurate.

Further, referring to FIG. 3, FIG. 5 and FIG. 6, the inclination acquisition mechanism 40 includes a base 41 arranged in parallel to the tabletop 51, a pressure-sensitive sensing element 42 arranged on the base 41, and a movable member 43 movably arranged on the base 41. The movable member 43 is arranged adjacent to the pressure-sensitive sensing element 42 and configured to contact the pressure-sensitive sensing element 42 when the base 41 tilts. The pressure-sensitive sensing element 42 is configured to sense a pressure applied by the movable member 43, convert the pressure into an electrical signal, and send the electrical signal to the controller, and the controller controls the motor 20 to operate based on the electrical signal. In this way, when the tabletop 51 of the wafer transfer machine 50 tilts, the base 41 tilts accordingly, the movable member 43 on the base 41 tilts towards the pressure-sensitive sensing element 42 and applies a pressure to the pressure-sensitive sensing element 42, the pressure-sensitive sensing element 42 senses the pressure applied by the movable member 43 accordingly, converts the pressure into an electrical signal, and sends the electrical signal to the controller, and the controller controls the motor 20 to operate according to the electrical signal. Specifically, the greater the inclination of the tabletop 51, the greater the force of the movable member 43 on the pressure-sensitive sensing element 42, and the greater the electrical signal outputted by the pressure-sensitive sensing element 42. The electrical signal is, for example, a voltage value. The voltage value increases with the increase in the pressure sensed by the pressure-sensitive sensing element 42, and the controller accordingly controls the number of turns of the rotation shaft of the motor 20 to increase, so as to adjust the tabletop 51 of the wafer transfer machine to a level condition.

Further, referring to FIG. 3, FIG. 5 and FIG. 6, the pressure-sensitive sensing element 42 is a varistor; and the movable member 43 is a movable ball. Specifically, the movable ball is a steel ball, an iron ball, or the like, which is not limited herein. When the tabletop 51 tilts, the movable ball on the base 41 is more sensitive during movement and can quickly contact the pressure-sensitive sensing element 42 and apply a pressure to the pressure-sensitive sensing element 42. When the tabletop 51 does not tilt, the movable ball on the base 41 may not apply any pressure to the pressure-sensitive sensing element 42. In some embodiments, the movable member 43 may also be, for example, a movable block slidably arranged on the base 41. When the tabletop 51 tilts, the movable block can also move on the base 41 and compress the pressure-sensitive sensing element 42.

Further, referring to FIG. 3, FIG. 5 and FIG. 6, the inclination acquisition mechanism 40 further includes two first baffles 44 oppositely spaced apart on the base 41, two pressure-sensitive sensing elements 42 are provided, and the two pressure-sensitive sensing elements 42 are arranged on the two first baffles 44 in one-to-one correspondence. In this way, whether a side portion of the tabletop 51 is too high or too low, the movable member 43 may contact the pressure-sensitive sensing element 42 on one of the two first baffles 44. That is, the pressure-sensitive sensing elements 42 may generate a corresponding electrical signal and send the electrical signal to the controller. The controller accordingly controls the rotation shaft of the motor 20 to rotate forward or backward, so as to adjust the levelness of the tabletop 51.

Further, referring to FIG. 3, FIG. 5 and FIG. 6, the inclination acquisition mechanism 40 further includes two second baffles 45 oppositely spaced apart on the base 41, and two ends of the second baffle 45 are connected to the two first baffles 44 respectively. The two first baffles 44 are located on left and right sides of the movable member 43 respectively. The two second baffles 45 are located on front and rear sides of the movable member 43 respectively. The two first baffles 44 and the two second baffles 45 surround the periphery of the movable member 43 to avoid movement of the movable member 43 to other places.

Further, referring to FIG. 3, FIG. 5 and FIG. 6, the pressure-sensitive sensing element 42 is plate-like, and the pressure-sensitive sensing element 42 is fitted to the first baffle 44; and the first baffle 44 and the second baffle 45 are not lower than the movable member 43.

Specifically, the base 41 is, for example, a square plate of 7 cm×7 cm, and the two first baffles 44 and the two second baffles 45 are arranged on four sides of the base 41 respectively. Thicknesses of the first baffle 44 and the second baffle 45 are, for example, 1 cm. The movable ball, for example, is a solid ball of 5 cm. The movable ball is arranged in a space enclosed by the two first baffles 44 and the two second baffles 45.

Figure 7:
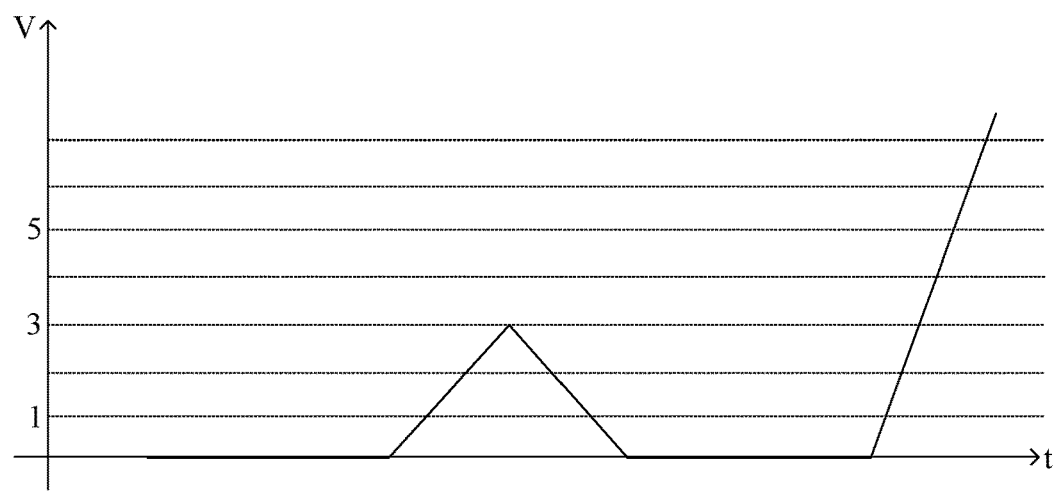
FIG. 7 is a schematic diagram of a voltage output curve of a semiconductor-machine automatic leveling apparatus according to some embodiments of the present disclosure.

Further, referring to FIG. 7, the semiconductor-machine automatic leveling apparatus further includes a display. The display is electrically connected to the controller and configured to display the inclination information. Specifically, the inclination information is represented by, for example, generating a voltage output curve, and the display displays the voltage output curve. The voltage output curve reflects degrees of inclination of the tabletop 51 of the wafer transfer machine 50 operating at different time points. The voltage output curve is represented specifically as follows. When a detected voltage is 0, indicating that the tabletop 51 does not tilt, the motor 20 is not required to operate and manual adjustment is not necessary. When the detected voltage is 0 to 2 v, indicating that the tabletop 51 slightly tilts to some extent, the motor 20 operates, the levelness of the tabletop 51 is timely adjusted to ensure that the tabletop 51 is in a level condition, and monitoring is continued. When the detected voltage is 2 v to 3 v, indicating that the inclination of the tabletop 51 is too large, the wafer transfer machine 50 stops running accordingly, and manual adjustment is performed, so that the tabletop 51 is in a level condition. When the detected voltage is above 3 v, indicating that the inclination of the tabletop 51 is great, the wafer transfer machine 50 stops running accordingly, and manual adjustment is performed, so that the tabletop 51 is in a level condition, so as to find out the reason for the significant tilt of the tabletop 51. That is, the voltage is proportional to the pressure sensed by the pressure-sensitive sensing element 42. The greater the detected voltage, the greater the pressure sensed by the pressure-sensitive sensing element 42, and the greater the inclination of the tabletop 51. Conversely, the smaller the detected voltage, the smaller the pressure sensed by the pressure-sensitive sensing element 42, and the smaller the inclination of the tabletop 51.

In addition, an inclination variation trend of the tabletop 51 in a recent time period of operation can be understood according to the voltage output curve, and it is easy to analyze the cause of the tilt of the tabletop 51 in combination with process steps at corresponding time points of the machine, which provides reference and guidance for subsequent operation of the process steps of the machine. For example, the voltage output curve may record voltage output values of the pressure-sensitive sensing element 42 in the last half month or one month. The voltage output values reflect the degrees of inclination of the tabletop 51. If the voltage output value at a certain time point in the voltage output curve is too large, it may be checked according to a machine record whether the tilt of the tabletop 51 is caused by personnel disassembly of the machine at the corresponding time point, and measures may be taken for prevention during next similar operation.

Further, the display may specifically be a display of a computer device, or a display of a mobile phone, or a display screen separately arranged outside a reaction machine, which is not limited herein. In addition, a machine host and a server are arranged between the controller and the display. The controller, the machine host, the server and the display are electrically connected in sequence.

Further, referring to FIG. 3, the semiconductor-machine automatic leveling apparatus further includes an adjustment component 60 and a transmission component 70. The adjustment component 60 is connected to the inclination adjusting gear 10 through the transmission component 70, and provided with an adjustment hole 61. In this way, when the inclination of the tabletop 51 is great, adjustment by operation of the motor 20 is not suitable in this case, and the following leveling manner is adopted: the wafer transfer machine 50 stops running, an adjustment tool, such as a crank, is inserted into the adjustment hole 61 to manually adjust the levelness of the tabletop 51, so that the tabletop 51 is in a level condition, so as to find out the reason for the significant tilt of the tabletop 51.

In one embodiment, referring to FIG. 3, the semiconductor-machine automatic leveling apparatus further includes a bubble levelness sensor 80, a camera 91 and a display screen. Specifically, the bubble levelness sensor 80 is configured to be arranged in parallel to the tabletop 51, or is arranged on the tabletop 51. The camera 91 is configured to acquire image information of the bubble levelness sensor 80 and electrically connected to the display screen, and the display screen is configured to display the image information. In this way, when the levelness of the tabletop 51 is required to be manually adjusted, the camera 91 acquires image information of the bubble levelness sensor 80, and the display screen displays the image information to facilitate the viewing of a position of a bubble in the bubble levelness sensor 80. The position of the bubble can be accurately displayed on the display screen, which provides convenience for manual adjustment.

It should be noted that, the display and the display screen may be integrated in one device or be two separate devices.

In some embodiments, the controller is further electrically connected to the camera 91 and further configured to analyze the inclination of the tabletop 51 according to the image information of the bubble levelness sensor 80. Specifically, if the position of the bubble in the bubble levelness sensor 80 is a middle position, the tabletop 51 is in a level position. If the position of the bubble in the bubble levelness sensor 80 is inclined to the left or right, the tabletop 51 tilts to the left or right. The more the position of the bubble is inclined to the left or right, the more the tabletop 51 tilts to the left or right. In this way, the controller can not only control the motor 20 to operate in combination with the electrical signal from the pressure-sensitive sensing element 42, but also control the motor 20 to operate according to the image information acquired by the camera, which can better adjust the tabletop 51 to a level condition and is highly accurate.

Figure 4:
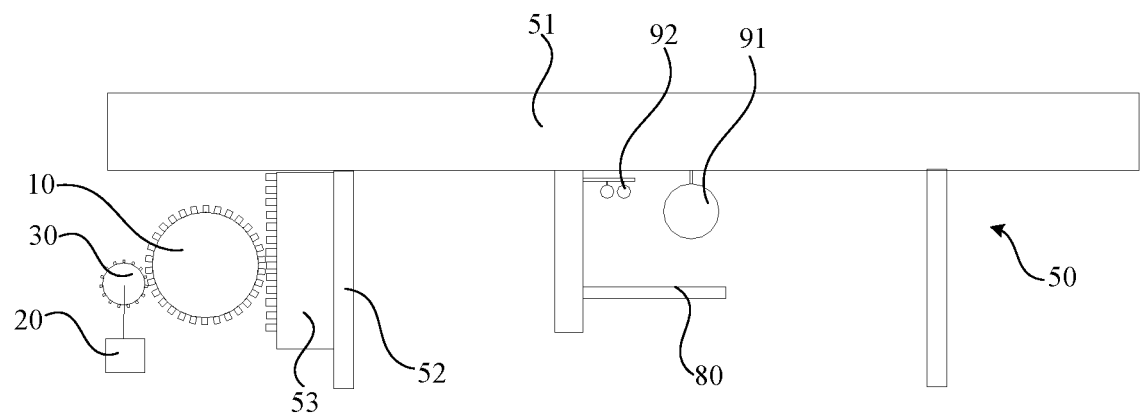
FIG. 4 is a schematic structural diagram of arrangement of a semiconductor-machine automatic leveling apparatus on a wafer transfer machine according to still some other embodiments of the present disclosure.

In some embodiments, referring to FIG. 4, the inclination acquisition mechanism 40 of the semiconductor-machine automatic leveling apparatus does not include components, such as the pressure-sensitive sensing element 42 and the movable member 43, but includes a bubble levelness sensor 80, a camera 91 and a controller. The bubble levelness sensor 80 is configured to represent a degree of inclination of the tabletop 51 of the wafer transfer machine 50, and the controller is electrically connected to the camera 91 and configured to analyze the inclination of the tabletop 51 according to image information of the bubble levelness sensor 80. Specifically, if the position of the bubble in the bubble levelness sensor 80 is a middle position, the tabletop 51 is in a level position. If the position of the bubble in the bubble levelness sensor 80 is inclined to the left or right, the tabletop 51 tilts to the left or right. The more the position of the bubble is inclined to the left or right, the more the tabletop 51 tilts to the left or right. During specific operation, when the inclination is small and automatic adjustment is performed, the bubble being in the middle position may be confirmed twice; that is, it is confirmed twice whether automatic adjustment is accurate. When the inclination is great, running is stopped, and manual adjustment is required. A main reference basis for the manual adjustment is whether the bubble is in the middle position.

Further, referring to FIG. 3 or FIG. 4, the semiconductor-machine automatic leveling apparatus further includes a lighting lamp 92. The lighting lamp 92 is arranged on the bubble levelness sensor 80, a switch is attached to the lighting lamp 92, and the lighting lamp 92 is configured to illuminate the bubble levelness sensor 80. In this way, when manual adjustment is required, the lighting lamp 92 can be turned on to increase brightness to easily view the position of the bubble in the bubble levelness sensor 80. The position of the bubble can be accurately displayed on the display screen, which provides convenience for manual adjustment.

In one embodiment, a leveling method of the semiconductor-machine automatic leveling apparatus includes the following steps.

In step S100, inclination information of a tabletop 51 of a wafer transfer machine 50 is acquired.

In step S200, a degree of inclination of the tabletop 51 is obtained according to the inclination information.

In step S300, the tabletop 51 is leveled according to the degree of inclination of the tabletop 51.

In the leveling method of the semiconductor-machine automatic leveling apparatus, the inclination acquisition mechanism 40 acquires the inclination information of the tabletop 51 of the wafer transfer machine 50 in real time, the controller analyzes according to the inclination information whether the tabletop 51 tilts, and if the tabletop 51 tilts, the controller controls the motor 20 to operate accordingly, the driving gear 30 on the rotation shaft of the motor 20 drives the inclination adjusting gear 10 to rotate accordingly, and the inclination adjusting gear 10 drives, during rotation, one side of the tabletop 51 of the wafer transfer machine 50 to move up and down, so that the tabletop 51 of the wafer transfer machine 50 can be adjusted to a horizontal plane in real time.

Further, step S300 specifically includes the following steps.

If the degree of inclination of the tabletop 51 is small, the controller controls the motor 20 to operate accordingly, the driving gear 30 on the rotation shaft of the motor 20 drives the inclination adjusting gear 10 to rotate accordingly, and the inclination adjusting gear 10 drives, during rotation, one side of the tabletop 51 of the wafer transfer machine 50 to move up and down to adjust the levelness of the tabletop 51.

When the controller judges that the tabletop 51 of the wafer transfer machine 50 slightly tilts, the controller controls the motor 20 to operate, so that the levelness of the tabletop 51 of the wafer transfer machine 50 can be timely adjusted and the tabletop 51 of the wafer transfer machine 50 can be in a good operation state, which avoids affecting the performance of the product, thereby improving the yield. Further, when it is judged that the tabletop 51 of the wafer transfer machine 50 slightly tilts, the wafer transfer machine 50 is chosen to be in an idle state, and the levelness of the tabletop 51 of the wafer transfer machine 50 is quickly adjusted, which can improve the working efficiency and product quality of the wafer transfer machine 50.

Specifically, when the detected voltage is 0 to 2 v, indicating that the tabletop 51 slightly tilts to some extent, the motor 20 operates, the levelness of the tabletop 51 is timely adjusted to ensure that the tabletop 51 is in a level condition, and monitoring is continued.

If the degree of inclination of the tabletop 51 is great, the wafer transfer machine 50 stops running, an adjustment tool is inserted into the adjustment hole 61, and the levelness of the tabletop 51 is manually adjusted by the adjustment tool. Moreover, the cause of the tilt of the tabletop 51 is found.

Specifically, when the detected voltage is 2 v to 3 v, indicating that the inclination of the tabletop 51 is too large, the wafer transfer machine 50 stops running accordingly, and manual adjustment is performed, so that the tabletop 51 is in a level condition. When the detected voltage is above 3 v, indicating that the inclination of the tabletop 51 is great, the wafer transfer machine 50 stops running accordingly, and manual adjustment is performed, so that the tabletop 51 is in a level condition; and the cause of the significant tilt of the tabletop 51 is found.

In addition, if it is observed through the display screen that, in the image information of the bubble levelness sensor 80 acquired by the camera 91, the position of the bubble is greatly inclined to the left or right, indicating that the tabletop 51 greatly tilts to the left or right, the wafer transfer machine 50 stops running, an adjustment tool is inserted into the adjustment hole 61, and the levelness of the tabletop 51 is manually adjusted by the adjustment tool. Moreover, the cause of the tilt of the tabletop 51 is found.

In addition, it should be noted that, the degree of inclination of the tabletop 51 may be set according to an actual situation. For example, when the degree of inclination of the tabletop 51 is less than 10°, the degree of inclination of the tabletop 51 is smaller. Conversely, when the degree of inclination of the tabletop 51 is greater than 10°, the degree of inclination of the tabletop 51 is greater.

In one embodiment, referring to FIG. 3, a wafer processing system includes the semiconductor-machine automatic leveling apparatus according to any one of the above embodiments, and further includes a wafer transfer machine 50. The inclination adjusting gear 10 is configured to drive one side of a tabletop 51 to move up and down. The inclination adjusting gear 10, the motor 20 and the driving gear 30 are all arranged on the wafer transfer machine 50.

In the wafer processing system, the inclination acquisition mechanism 40 acquires inclination information of the tabletop 51 of the wafer transfer machine 50 in real time, the controller analyzes, according to the inclination information, whether the tabletop 51 tilts, and if the tabletop 51 tilts, the controller controls the motor 20 to operate accordingly, the driving gear 30 on the rotation shaft of the motor 20 drives the inclination adjusting gear 10 to rotate accordingly, and the inclination adjusting gear 10 drives, during rotation, one side of the tabletop 51 of the wafer transfer machine 50 to move up and down, so that the tabletop 51 of the wafer transfer machine 50 can be adjusted to a horizontal plane in real time.

In one embodiment, the wafer transfer machine 50 includes a guide rail 52 and a rack 53. The rack 53 is movably arranged on the guide rail 52, an end portion of the rack 53 is arranged below one side of the tabletop 51, and the rack 53 is engaged with the inclination adjusting gear 10. In this way, when rotating, the inclination adjusting gear 10 drives the rack 53 to move along the guide rail 52 accordingly, and the rack 53 drives one side of the tabletop 51 to move up and down when moving along the guide rail 52, so as to adjust the levelness of the tabletop 51.

It may be understood that a transmission structure between the inclination adjusting gear 10 and the tabletop 51 of the wafer transfer machine 50 is not limited to the guide rail 52 and the rack 53, which may also be other structures.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, which are described specifically and in detail, and therefore cannot be construed as a limitation on the patent scope of the present disclosure. It should be pointed out that those of ordinary skill in the art may make various changes and improvements without departing from the ideas of the present disclosure, which shall all fall within the protection scope of the present disclosure. Therefore, the patent protection scope of the present disclosure shall be subject to the appended claims.

What is claimed is:

1. A semiconductor-machine automatic leveling apparatus, comprising:
   an inclination adjusting gear configured to drive one side of a tabletop of a wafer transfer machine to move up and down;
   a motor and a driving gear, the driving gear being mounted on a rotation shaft of the motor, and the driving gear being engaged with the inclination adjusting gear; and
   an inclination acquisition mechanism and a controller, the inclination acquisition mechanism being configured to acquire inclination information of the tabletop of the wafer transfer machine, the inclination acquisition mechanism being electrically connected to the controller, the controller being electrically connected to the motor, and the controller being configured to control the motor to operate according to the inclination information,
   wherein the inclination acquisition mechanism comprises a base arranged in parallel to the tabletop, a pressure-sensitive sensing element arranged on the base, and a movable member movably arranged on the base, the movable member being arranged adjacent to the pressure-sensitive sensing element, and the movable member is configured to contact the pressure-sensitive sensing element when the base tilts, the pressure-sensitive sensing element is configured to sense a pressure applied by the movable member, convert the pressure into an electrical signal, and send the electrical signal to the controller, and the controller controls the motor to operate according to the electrical signal.

2. The semiconductor-machine automatic leveling apparatus according to claim 1, wherein the pressure-sensitive sensing element is a varistor; and the movable member is a movable ball.

3. The semiconductor-machine automatic leveling apparatus according to claim 1, wherein the inclination acquisition mechanism further comprises two first baffles oppositely spaced apart on the base, two pressure-sensitive sensing elements are provided, and the two pressure-sensitive sensing elements are arranged on the two first baffles in one-to-one correspondence.

4. The semiconductor-machine automatic leveling apparatus according to claim 3, wherein the inclination acquisition mechanism further comprises two second baffles oppositely spaced apart on the base, and two ends of the second baffle are connected to the two first baffles respectively.

5. The semiconductor-machine automatic leveling apparatus according to claim 4, wherein the pressure-sensitive sensing element is plate-like, and the pressure-sensitive sensing element is fitted to the first baffle; and the first baffle and the second baffle are not lower than the movable member.

6. The semiconductor-machine automatic leveling apparatus according to claim 1, further comprising a display electrically connected to the controller, the display being configured to display the inclination information.

7. A semiconductor-machine automatic leveling apparatus, comprising:
- an inclination adjusting gear configured to drive one side of a tabletop of a wafer transfer machine to move up and down;
- a motor and a driving gear, the driving gear being mounted on a rotation shaft of the motor, and the driving gear being engaged with the inclination adjusting gear;
- an inclination acquisition mechanism and a controller, the inclination acquisition mechanism being configured to acquire inclination information of the tabletop of the wafer transfer machine, the inclination acquisition mechanism being electrically connected to the controller, the controller being electrically connected to the motor, and the controller being configured to control the motor to operate according to the inclination information; and
- an adjustment component and a transmission component, the adjustment component being connected to the inclination adjusting gear through the transmission component, and the adjustment component being provided with an adjustment hole.

8. The semiconductor-machine automatic leveling apparatus according to claim 7, further comprising a bubble levelness sensor, a camera and a display screen, the bubble levelness sensor being arranged in parallel to the tabletop, the camera being configured to acquire image information of the bubble levelness sensor, the camera being electrically connected to the display screen, and the display screen being configured to display the image information.

9. The semiconductor-machine automatic leveling apparatus according to claim 8, further comprising a lighting lamp arranged on the bubble levelness sensor, a switch being attached to the lighting lamp, and the lighting lamp being configured to illuminate the bubble levelness sensor.

10. The semiconductor-machine automatic leveling apparatus according to claim 1, further comprising a driver arranged between the controller and the motor, the controller being electrically connected to the motor through the driver, and the motor rotating by a preset angle under the control of the driver.

11. The semiconductor-machine automatic leveling apparatus according to claim 1, further comprising a photoelectric code disk and a storage circuit, the photoelectric code disk being electrically connected to the controller, the storage circuit being electrically connected to the controller, and the controller being configured to calculate a rotation angle of the rotation shaft of the motor according to the photoelectric code disk and configured to record, through the storage circuit, the inclination information outputted by the pressure-sensitive sensing element and the rotation angle of the rotation shaft of the motor.

12. The semiconductor-machine automatic leveling apparatus according to claim 11, further comprising a signal conditioning circuit arranged between the pressure-sensitive sensing element and the controller, the pressure-sensitive sensing element being electrically connected to the controller through the signal conditioning circuit.

13. The semiconductor-machine automatic leveling apparatus according to claim 11, wherein an outer diameter of the driving gear is less than that of the inclination adjusting gear.

14. A leveling method of the semiconductor-machine automatic leveling apparatus according to claim 1, comprising:
- acquiring inclination information of a tabletop of a wafer transfer machine;
- obtaining a degree of inclination of the tabletop according to the inclination information; and
- leveling the tabletop according to the degree of inclination of the tabletop,
- wherein the leveling the tabletop according to the degree of inclination of the tabletop comprises:
- controlling, by the contoller, the motor to operate accordingly, driving, by the driving gear on the rotation shaft of the motor, the inclination adjusting gear to rotate accordingly, and driving, by the inclination adjusting gear during rotation, one side of the tabletop of the wafer transfer machine to move up and down to adjust the levelness of the tabletop if the degree of inclination of the tabletop is small; and
- stopping running of the wafer transfer machine, inserting an adjustment tool into the adjustment hole, and manually adjusting, by the adjustment toll, the levelness of the tabletop if the degree of inclination of the tabletop is great.

15. A wafer processing system comprising the semiconductor-machine automatic leveling apparatus according to claim 1, and further comprising a wafer transfer machine, the inclination adjusting gear being configured to drive one side of a tabletop to move up and down; and the inclination adjusting gear, the motor and the driving gear being all arranged on the wafer transfer machine.

16. The wafer processing system according to claim 15, wherein the wafer transfer machine comprises a guide rail and a rack, the rack is movably arranged on the guide rail, an end portion of the rack is arranged below one side of the tabletop, and the rack is engaged with the inclination adjusting gear.

* * * * *